United States Patent
Kim et al.

(10) Patent No.: US 11,619,664 B2
(45) Date of Patent: Apr. 4, 2023

(54) METHOD FOR DETECTING CONNECTION DEFECT OF CONNECTOR, AND CONNECTING SYSTEM PROVIDING THE METHOD

(71) Applicants: Hyundai Motor Company, Seoul (KR); Kia Corporation, Seoul (KR)

(72) Inventors: Seungwoo Kim, Anyang-si (KR); Daehyun Kim, Bucheon-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 125 days.

(21) Appl. No.: 17/349,200

(22) Filed: Jun. 16, 2021

(65) Prior Publication Data

US 2022/0209472 A1 Jun. 30, 2022

(30) Foreign Application Priority Data

Dec. 31, 2020 (KR) ........................ 10-2020-0189776

(51) Int. Cl.
| | |
|---|---|
| *G01R 31/00* | (2006.01) |
| *H01M 10/42* | (2006.01) |
| *G01R 31/69* | (2020.01) |
| *H01M 50/543* | (2021.01) |
| *G01R 31/364* | (2019.01) |

(52) U.S. Cl.
CPC ........... *G01R 31/006* (2013.01); *G01R 31/69* (2020.01); *H01M 10/425* (2013.01); *G01R 31/364* (2019.01); *H01M 50/543* (2021.01); *H01M 2010/4278* (2013.01)

(58) Field of Classification Search
None
See application file for complete search history.

(56) References Cited

U.S. PATENT DOCUMENTS

| | | | | |
|---|---|---|---|---|
| 5,944,546 A | * | 8/1999 | Miyake | .................. H01R 24/46 200/51.03 |
| 2006/0049942 A1 | * | 3/2006 | Sakama | ........... G06K 19/07758 340/572.1 |

* cited by examiner

*Primary Examiner* — Jas A Sanghera
(74) *Attorney, Agent, or Firm* — Slater Matsil, LLP

(57) ABSTRACT

An embodiment connecting system includes a branch connector connected to a battery and configured to branch a high voltage, a first interlock circuit within the branch connector configured to form a closed circuit by being connected to a second interlock circuit within a load connector when the load connector that transfers the branched high voltage to a load is connected to the branch connector, a transmitting antenna transmitting a radio wave when the closed circuit is formed, and a controller identifying the branch connector based on a resonance frequency of the radio wave and determining whether a connection defect occurs in the identified branch connector based on an electric field strength of the radio wave, wherein the resonance frequency corresponds to a conductor pattern formed at a predetermined position of the transmitting antenna.

20 Claims, 8 Drawing Sheets

[PRIOR ART]

[PRIOR ART]

[PRIOR ART]

METHOD FOR DETECTING CONNECTION DEFECT OF CONNECTOR, AND CONNECTING SYSTEM PROVIDING THE METHOD

CROSS-REFERENCE TO RELATED APPLICATIONS

This application claims the benefit of Korean Patent Application No. 10-2020-01189776, filed on Dec. 31, 2020, which application is hereby incorporated herein by reference.

TECHNICAL FIELD

The present invention relates to a method for detecting a connection defect of a connector, and a connecting system providing the method.

BACKGROUND

A high voltage battery mounted on an electric vehicle not only supplies electrical energy to a motor that drives the electric vehicle, but may also supply electric power to various devices mounted on the electric vehicle. For example, the electric vehicle may be equipped with a high voltage junction box (or high voltage junction block) that distributes electric power from the high voltage battery to each device (load) through an internal busbar. At this time, the high voltage junction box may include a plurality of male connectors to be electrically connected to each female connector of a plurality of devices (load).

The connecting system includes a male connector on the high voltage junction box side and a female connector on the load side that is electrically connected thereto, and when the male connector and female connector are connected to each other in the normal state, electrical energy is supplied from the high voltage battery to each device (load) of the vehicle.

In addition, an interlock terminal is provided for each of the male connector and the female connector, and an interlock circuit via the interlock terminal between the male connector and the female connector may be installed in the connector device that includes the male connector and the female connector. Therefore, when unintended removal occurs between the male connector and the female connector, it may be detected by the interlock circuit.

FIG. 1 and FIG. 2 schematically illustrate a conventional connecting system. FIG. 1 is an example in which all connections between a plurality of connectors are in the normal state, and FIG. 2 is an example in which some connectors are in the abnormal state, i.e., not interconnected. At this time, FIG. 1 and FIG. 2 illustrates that a single controller is employed to check the connection state of a plurality of connectors.

Referring to FIG. 1 and FIG. 2, for example, when a plurality of connectors are all normally connected, the interlock circuit is closed to form an interlock closed circuit such that a current may flow, and then, the controller may detect the current or voltage in the interlock circuit and may determine that the plurality of connectors are all normally connected. Meanwhile, when any one of a plurality of connectors is removed as shown in FIG. 2, it may be detected that the interlock circuit is open, but there is a limit in which it cannot accurately distinguish which connector has an error.

FIG. 3 schematically illustrates a conventional connecting system. Specifically, it is an example of a technique for confirming normal or abnormal connector connection by providing a controller for each of a plurality of connectors. In this case, since an interlock circuit and a controller are coupled for each connector, even if abnormal connection such as removal of some of a plurality of connectors occurs, the removed connector may be detected. However, since the interlock circuits and controllers are required in a quantity corresponding to the number of load connectors, the cost of implementation increases and the circuit inside the junction box becomes complicated.

The above information disclosed in this Background section is only for enhancement of understanding of the background of the invention, and therefore it may contain information that does not form the prior art that is already known to a person of ordinary skill in the art.

SUMMARY

The present invention relates to a method for detecting a connection defect of a connector, and a connecting system providing the method. Particular embodiments relate to a method for easily detecting a connector having a defect on a connection among a plurality of connectors with a single controller, and a connecting system providing the method.

Embodiments of the present invention provide a method for detecting a connection defect of a connector, which is capable of easily detecting a connector having a defect among a plurality of connectors with a single controller, and a connecting system providing the method.

A connecting system includes a branch connector connected to a battery to branch a high voltage, a first interlock circuit within the branch connector, configured to form a closed circuit by being connected to a second interlock circuit within a load connector, when the load connector that transfers the branched high voltage to a load is connected to the branch connector, a transmitting antenna configured to, when the closed circuit is configured, receive electric power from a power source to transmit a radio wave, and a controller configured to identify the branch connector based on a resonance frequency of the radio wave, and determine whether a connection defect occurs in the identified branch connector based on an electric field strength of the radio wave, wherein the resonance frequency corresponds to a conductor pattern formed at a predetermined position of the transmitting antenna.

The transmitting antenna may be configured at a first end of the first interlock circuit. The resonance frequency may include a resonance frequency band or a resonance frequency bandwidth.

The connecting system may further include a plurality of branch connectors each of which includes the first interlock circuit and the transmitting antenna, where the plurality of transmitting antennas may transmit radio waves of different resonance frequency bands or different resonance frequency bandwidths.

The plurality of transmitting antennas may include a monopole antenna that transmits radio waves of different resonance frequency bands.

The controller may be configured to determine that the connection defect of the identified branch connector has occurred when the electric field strength of the radio wave is smaller than or equal to a predetermined reference value.

The controller may be configured to identify the branch connector and determine whether the connection has occurred in the identified branch connector by matching a lookup table and the received radio wave.

A method for detecting a connector having a connection defect on a connection between a branch connector connected to a battery to branch a high voltage and a plurality of connectors that include a load connector that transfers the branched high voltage to a load is provided. The method includes receiving a radio wave transmitted by a plurality of transmitting antennas supplied with electric power, when a closed circuit configured as a first interlock circuit within the branch connector is connected to a second interlock circuit within the load connector at the time of connection of the branch connector and the load connector, and identifying the plurality of connectors based on a resonance frequency of the radio wave. In addition, the method includes determining whether a connection defect occurs for each of the plurality of connectors based on an electric field strength of the radio wave. The resonance frequency may correspond to a conductor pattern formed at a predetermined position of the transmitting antenna.

The identifying of the plurality of connectors may identify the plurality of connectors based on the resonance frequency band or resonance frequency bandwidth of the radio wave.

The identifying of the plurality of connectors may match the resonance frequency band or resonance frequency bandwidth of the radio wave with a lookup table to identify the plurality of connectors.

The determining of whether a connection defect occurs for each of the plurality of connectors may determine that, when the electric field strength of the radio wave is smaller than or equal to a predetermined reference value, the connection defect has occurred at a corresponding connector.

The reference value may be stored in a lookup table.

According to an embodiment, a resonance circuit of an antenna is installed in each connector to identify respective connectors by their resonance frequencies, and a connection defect of each connector is determined based on an electric field strength. Thereby, a defective connector in an apparatus having a plurality of connectors may be easily detected at a low cost.

DETAILED DESCRIPTION OF ILLUSTRATIVE EMBODIMENTS

Figure 1:
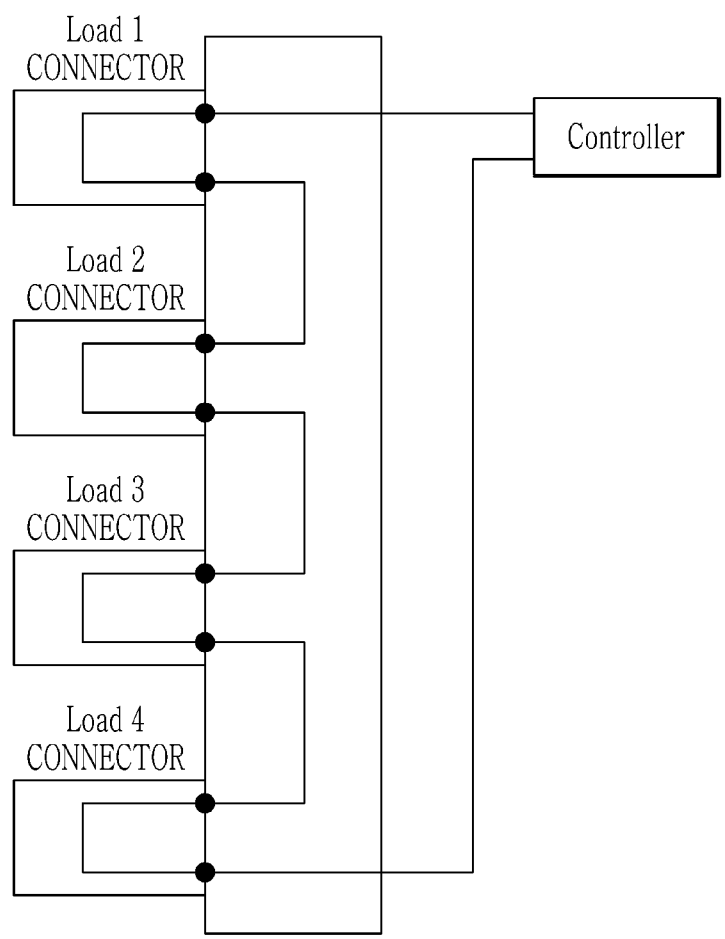
FIG. 1, FIG. 2, and FIG. 3 schematically illustrate a conventional connecting system.
Figure 2:
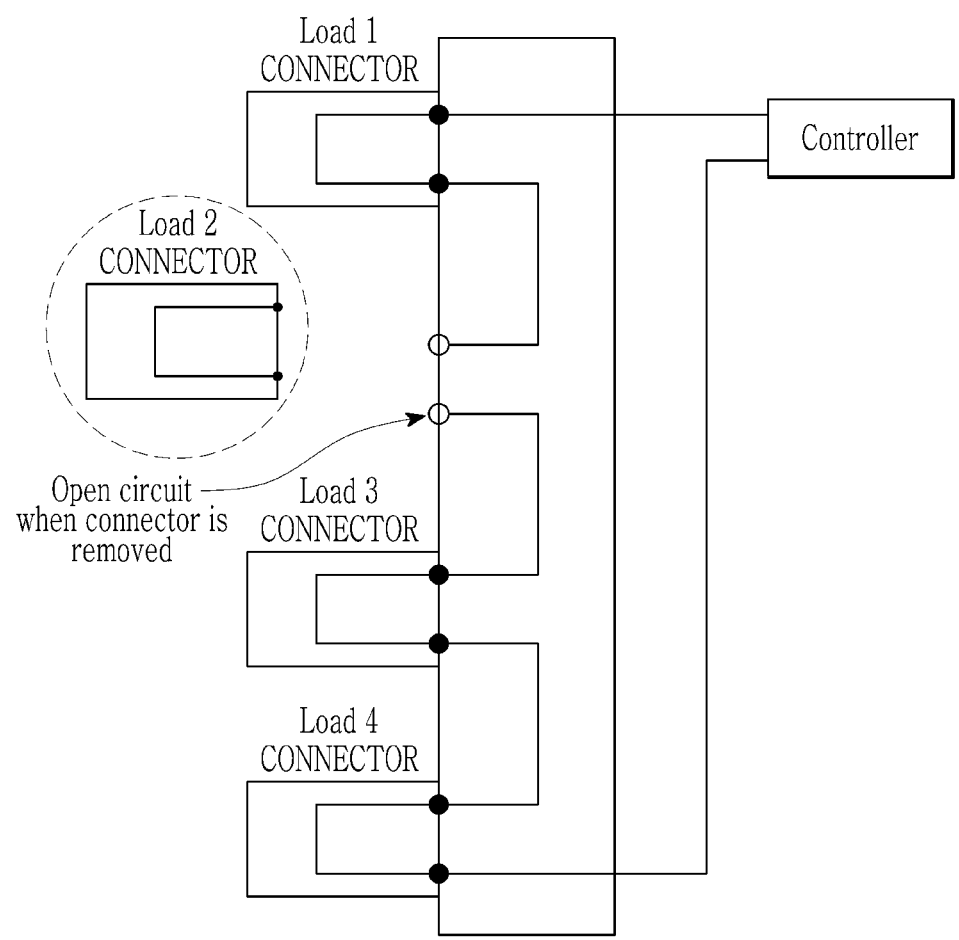
Figure 3:
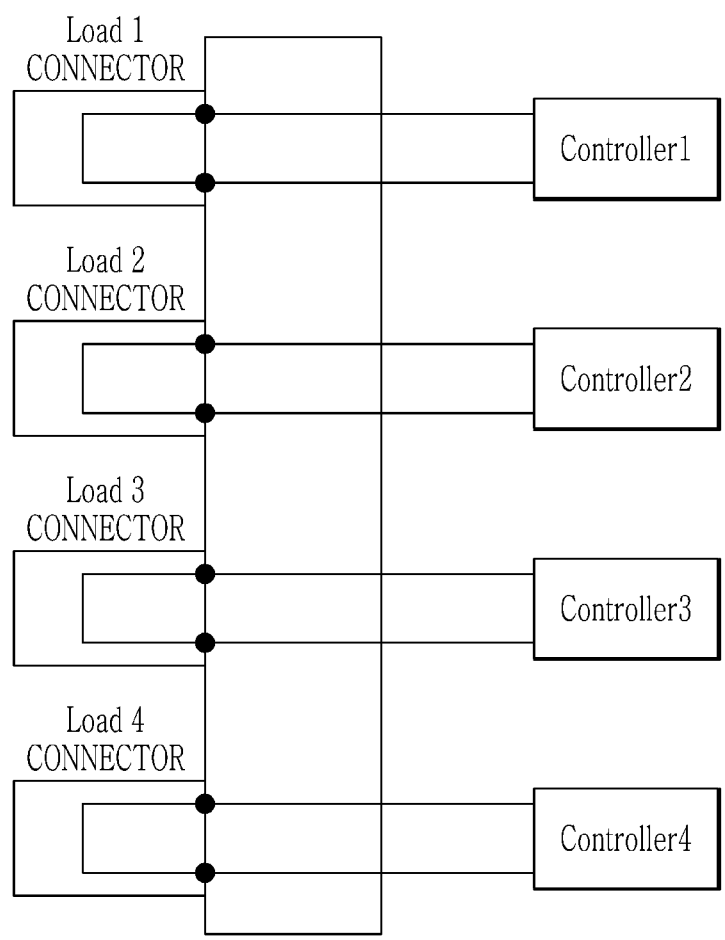

Hereinafter, exemplary embodiments disclosed in the present specification will be described in detail with reference to the accompanying drawings. In the present specification, the same or similar components will be denoted by the same or similar reference numerals, and a repeated description thereof will be omitted. Terms "module" and/or "unit" for components used in the following description are used only in order to easily describe the specification. Therefore, these terms do not have meanings or roles that distinguish them from each other in and of themselves. In describing exemplary embodiments of the present specification, when it is determined that a detailed description of the well-known art associated with the present invention may obscure the gist of the present invention, it will be omitted. The accompanying drawings are provided only in order to allow exemplary embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to the other component or may be connected or coupled to the other component with a further component intervening therebetween. Further, it is to be understood that when one component is referred to as being "directly connected" or "directly coupled" to another component, it may be connected or coupled directly to the other component without a further component intervening therebetween.

It will be further understood that terms "comprise" and "have" used in the present specification specify the presence of stated features, numerals, steps, operations, components, parts, or combinations thereof, but do not preclude the presence or addition of one or more other features, numerals, steps, operations, components, parts, or combinations thereof.

Figure 4:
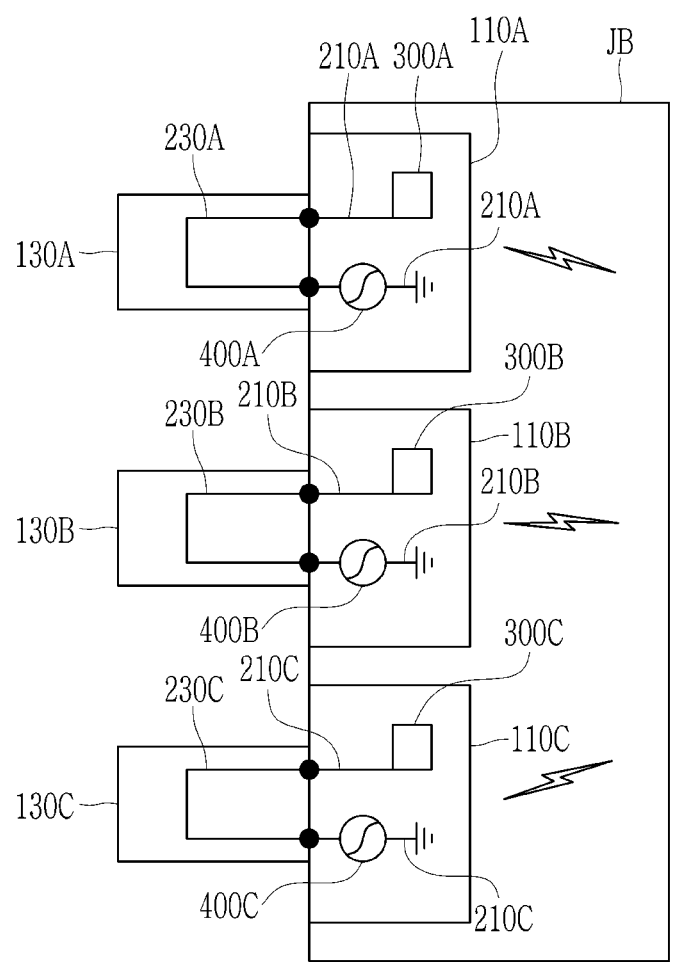
FIG. 4 illustrates a connecting system according to an exemplary embodiment.
Figure 4:
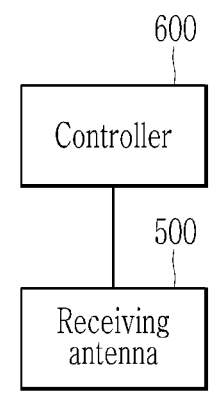
Figure 5:
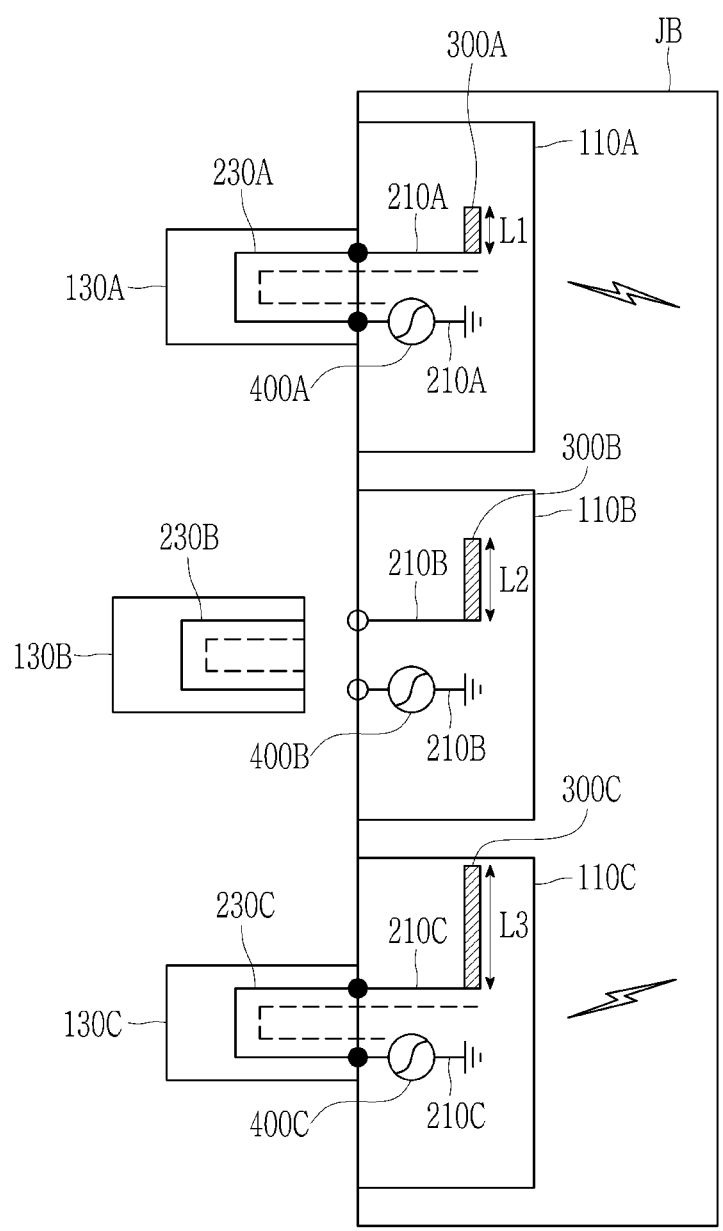
FIG. 5 illustrates a connecting system that detects a connector having a defect according to an exemplary embodiment.
Figure 6:
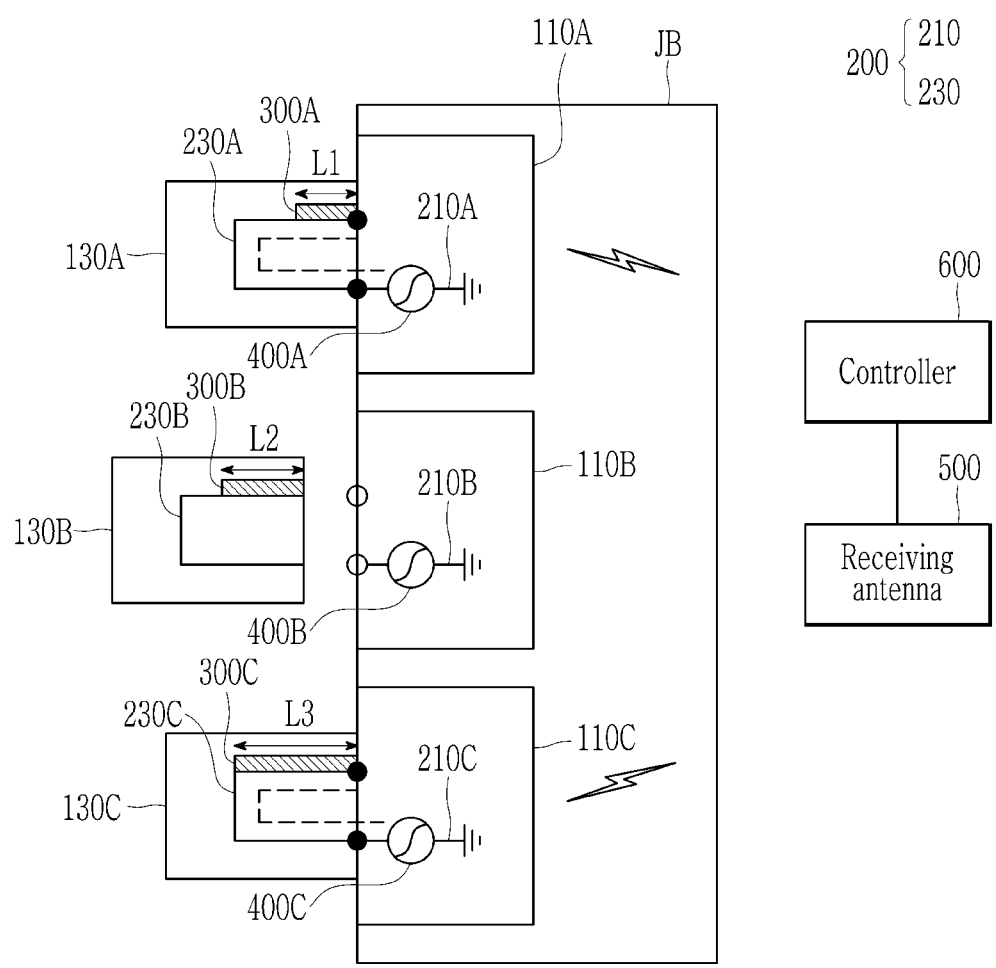
FIG. 6 illustrates a connecting system that detects a connector having a defect according to another exemplary embodiment.
Figure 7:
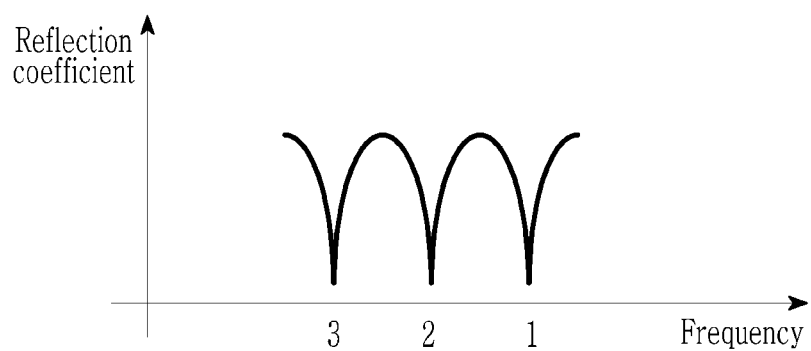
FIG. 7 and FIG. 8 are reference diagrams showing a radiation characteristic of a resonance frequency according to an exemplary embodiment when a defect occurs in a predetermined connector.
Figure 8:
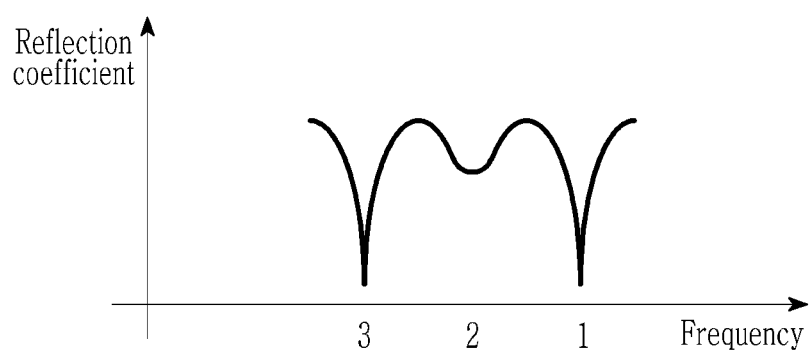

FIG. 4 illustrates a connecting system according to an exemplary embodiment, FIG. 5 illustrates a connecting system that detects a connector having a defect according to an exemplary embodiment, FIG. 6 illustrates a connecting system that detects a connector having a defect according to another exemplary embodiment, and FIG. 7 and FIG. 8 are reference diagrams showing a radiation characteristic of a resonance frequency according to an exemplary embodiment when a defect occurs in a predetermined connector.

Referring to FIG. 4, a connecting system includes a connector 100, an interlock circuit 200, a transmitting antenna 300, a power source 400, a receiving antenna 500, and a controller 600.

The connector 100 includes a branch connector no connected to a battery to branch a high voltage of the battery, and a load connector 130 that transfers the branched high voltage to a load. The branch connector no and the load connector 130 are paired with each other to include the structure of a male connector and a female connector.

The connecting system may include a plurality of connectors 100 (i.e., 100A, 100B, and 100C). The plurality of connectors 100 (i.e., 100A, 100B, and 100C) may include a plurality of branch connectors no (i.e., 110A, 110B, 110C) and a plurality of load connectors 130 (i.e., 130A, 130B, 130C) that form pairs with the plurality of branch connectors no. For example, referring to FIG. 4, the plurality of branch connectors no (i.e., 110A, 110B, 110C) may be included in a junction box JB that distributes electric power of the high voltage battery to a plurality of loads.

The interlock circuit 200 may include a first interlock circuit 210 installed inside the branch connector no and a second interlock circuit 230 installed inside the load connector 130. According to an exemplary embodiment, a first interlock terminal (not shown) connected to the first interlock circuit 210 may be formed at a predetermined position outside the branch connector no, and the first interlock terminal (not shown) connected to the second interlock circuit 230 may be formed at a predetermined position outside the load connector 130.

For example, when the branch connector no and the load connector 130 are interconnected (i.e., coupled with each other), the first interlock terminal and the second interlock terminal are also interconnected (i.e., coupled with each other). Then, the first interlock circuit 210 and the second interlock circuit 230 are interconnected, and the interlock circuit 200 may form a closed circuit.

Referring to FIG. 4 and FIG. 5, a first end of the interlock circuit 200 forming the closed circuit according to an exemplary embodiment may be connected to the transmitting antenna 300 positioned at the branch connector no, and a second end thereof may be connected to the power source 400 positioned at the branch connector no. Referring to FIG. 6, the first end of the interlock circuit 200 forming the closed circuit according to another exemplary embodiment may be connected to the transmitting antenna 300 positioned at the load connector 130, and a second end thereof may be connected to the power source 400 positioned at the branch connector no. When the interlock circuit 200 forms the closed circuit, electric power may be supplied from the power source 400 to the transmitting antenna 300.

The transmitting antenna 300 may receive electric power from the power source 400 and transmit a radio wave. Referring to FIG. 4 and FIG. 5, according to an exemplary embodiment, the transmitting antenna 300 may be positioned at a first end of the first interlock circuit 210. Referring to FIG. 6, according to another exemplary embodiment, the transmitting antenna 300 may be positioned at a first end of the second interlock circuit 230.

The transmitting antenna 300 may be configured such that a conductor pattern corresponding to a resonance frequency of the radio wave is formed at a predetermined position. At this time, the resonance frequency may include a resonance frequency band or a resonance frequency bandwidth. As for the resonance frequency, the resonance frequency band or the resonance frequency bandwidth may be determined according to the length or thickness of the conductor pattern.

For example, a plurality of transmitting antennas 300 (i.e., 300A, 300B, and 300C) may include different conductor patterns respectively, to transmit radio waves having different resonance frequencies (the resonance frequency band or the resonance frequency bandwidth). Referring to FIG. 5, the transmitting antenna 300 positioned at the first end of the first interlock circuit 210 is formed as a monopole antenna, and the plurality of transmitting antennas 300 (i.e., 300A, 300B, and 300C) may respectively have conductor patterns of different lengths L1, L2, and L3. Referring to FIG. 6, the transmitting antenna 300 positioned at the first end of the second interlock circuit 230 may be formed as a monopole antenna, and the plurality of transmitting antennas 300 (i.e., 300A, 300B, and 300C) may respectively have conductor patterns of different lengths L1, L2, and L3. Then, the resonance frequency bands of the radio waves transmitted by the plurality of transmitting antennas 300 (i.e., 300A, 300B, and 300C) may be different from one another.

The conductor pattern may be implemented as a copper film. For example, depending on the length of the copper film, the shape of the copper film, or the thickness of the copper film, the resonance frequency band or the resonance frequency bandwidth of the radio wave transmitted by the transmitting antenna 300 may be different.

The power source 400 may be positioned at a second end of the first interlock circuit 210 or a second end of the second interlock circuit 230 to supply electric power to the transmitting antenna 300 when the interlock circuit 200 forms a closed circuit. For example, the power source 400 may include a low voltage battery, but is not limited thereto.

The receiving antenna 500 may receive a radio wave transmitted from the plurality of transmitting antennas 300 (i.e., 300A, 300B, and 300C) and transfer it to the controller 600. For example, the receiving antenna 500 may be configured to receive radio waves of various resonance frequencies.

The controller 600 may identify the connector 100 based on the resonance frequency of the received radio wave, and may determine a connection defect of the connector 100 based on the electric field strength of the received radio wave.

The controller 600 may identify the plurality of connectors 100 (i.e., 100A, 100B, and 100C) based on the resonance frequency of the radio wave. Referring to Table 1 below, the controller 600 may identify the branch connectors 110 (i.e., 110A, 110B, and 110C) constituting the connector 100 by matching the resonance frequency of the received radio wave with a lookup table.

The controller 600 may detect the connector 100 having a connection defect among the plurality of connectors 100 (i.e., 100A, 100B, and 100C) based on the electric field strength of the radio wave. Referring to Table 1 below, the controller 600 compares a reference value corresponding to each resonance frequency in the lookup table with an electric field strength of the radio wave matched with the resonance frequency. When the electric field strength is smaller than or equal to a predetermined reference value, the controller 600 may determine that the connection defect of the connector 100 has occurred. For example, the controller 600 may identify the branch connectors no (i.e., 110A, 110B, and 110C) having a defect in the connection to the load connector 130.

TABLE 1

| | Conductor pattern length (mm) | Resonance frequency (Hz) | Electric field strength (dBµV) |
|---|---|---|---|
| Connector A | 7 mm | 10.71 GHz | a |
| Connector B | 8 mm | 9.37 GHz | b |
| Connector C | 9 mm | 8.33 GHz | c |

Referring to Table 1, the electric field strength is an example of a strength of the radio wave. For example, the electric field strength may be expressed as a strength of the electric field of the radio wave. The strength of the electric field (V/m) may be expressed as the level of the voltage induced in the antenna of an effective length of 1 m. Alternatively, the strength of the electric field may be expressed in decibel dB with reference of 1 µV/m). For example, the reference value may correspond to the electric field strength of the radio wave transmitted by the transmitting antenna 300 when the connector 100 is normally connected.

Referring to FIG. 5 and FIG. 6, it is assumed that the first connector 100A and the third connector 100C are normally connected, and the second connector 100B has a connection defect, for example, due to incompleteness or removal. At this time, the electric field strength of the radio wave transmitted by the second transmitting antenna 300B corresponding to the second connector 100B may be smaller than or equal to the predetermined reference value. Hereinafter, the first transmitting antenna 300A, the second transmitting antenna 300B, and the third transmitting antenna 300C are respectively the transmitting antenna 300 positioned within the first connector 100A, the second connector 100B and the third connector 100C.

When the connection of the connector 100 is normal, the transmitting antenna 300 may receive electric power from the power source 400 and transmit a radio wave corresponding to the predetermined electric field strength. Then, a reflection coefficient, an index showing the radiation performance of each radio wave, may also show a predetermined value. Referring to FIG. 7, the reflection coefficient of the radio wave transmitted by each of the first transmitting antenna 300A, the second transmitting antenna 300B, and the third transmitting antenna 300C shows a predetermined value. At this time, each of the frequencies 3, 2, and 1 shown in FIG. 7 may correspond to the resonance frequency of the radio wave transmitted by the first transmitting antenna 300A, the second transmitting antenna 300B, and the third transmitting antenna 300C, respectively.

When the connection of the connector 100 is abnormal (i.e., when the connection defect occurs), for example, specifically, when the connection of the second connector 100B is abnormal, the second transmitting antenna 300B may not receive normal electric power from the power source 400 and may not be capable of transmitting a wave corresponding to the predetermined electric field strength. Then, the reflection coefficient, the index showing radiation performance of the radio wave, may not show the predetermined value, either. Referring to FIG. 8, although the reflection coefficients of the radio waves transmitted by the first transmitting antenna 300A and the third transmitting antenna 300C are the same as the reflection coefficient shown in FIG. 7, the reflection coefficient of the radio wave transmitted by the second transmitting antenna 300B is different from the reflection coefficient shown in FIG. 7 and fails to shown the predetermined value. At this time, each of the frequencies 3, 2, and 1 shown in FIG. 8 may correspond to the resonance frequency of the radio wave transmitted by each of the first transmitting antenna 300A, the second transmitting antenna 300B, and the third transmitting antenna 300C.

The reflection coefficient is a ratio of a reflected voltage relative to a voltage applied to a specific port, and may be an index showing a radiation characteristic of a radio wave. For example, if the reflection coefficient is '0', it may mean that the applied voltage is all radiated or consumed inside the system. If the reflection coefficient is '1', it may mean that the applied voltage is not radiated or consumed inside the system and is fully reflected.

Figure 9:
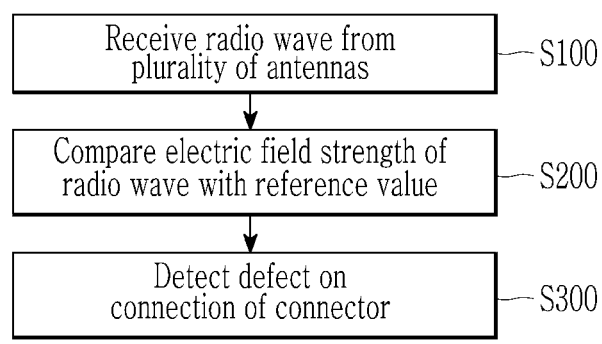
FIG. 9 is a flowchart showing a method for detecting a connector having a defect according to an exemplary embodiment.

FIG. 9 is a flowchart showing a method for detecting a connector having a defect according to an exemplary embodiment.

Hereinafter, a method for detecting a connector having a defect is described in detail with reference to FIG. 4 to FIG. 9.

First, at step S100, the controller 600 may receive the radio wave transmitted by the plurality of transmitting antennas 300 (i.e., 300A, 300B, and 300C) through the receiving antenna 500.

For example, each of the plurality of transmitting antennas 300 (i.e., 300A, 300B, and 300C) may include different conductor patterns to transmit different radio waves having different resonance frequency bands. For another example, each of the plurality of transmitting antennas 300 (i.e., 300A, 300B, and 300C) may include different conductor patterns to transmit different radio waves having different resonance frequency bandwidths.

Subsequently at step S200, the controller 600 may identify the plurality of connectors 100A, 100B, and 100C based on the resonance frequency of the radio wave.

Referring to the Table 1, the controller boo may identify the plurality of connectors 100A, 100B, and 100C by matching the resonance frequency of the received radio wave with a lookup table. In the lookup table, the plurality of connectors 100A, 100B, and 100C, the plurality of transmitting antennas 300A, 300B, and 300C, and the plurality of resonant frequencies may be mapped and stored.

Subsequently at step S300, the controller 600 may determine an occurrence of a connection defect based on the electric field strength of the radio wave, and detect the connector 100 having a connection defect among the plurality of connectors 100A, 100B, and 100C.

For example, when the electric field strength is smaller than or equal to a predetermined reference value, the controller 600 may determine that a connection defect has occurred at a corresponding connector wo. At this time, the reference value is a reference value for the electric field strength corresponding to each of a plurality of the resonance frequencies, and may be stored in a lookup table.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A connecting system, comprising:
a branch connector connected to a battery and configured to branch a high voltage;
a first interlock circuit within the branch connector configured to form a closed circuit by being connected to a second interlock circuit within a load connector when the load connector that transfers the branched high voltage to a load is connected to the branch connector;
a transmitting antenna configured to receive electric power from a power source to transmit a radio wave when the closed circuit is formed; and
a controller configured to identify the branch connector based on a resonance frequency of the radio wave and to determine whether a connection defect occurs in the identified branch connector based on an electric field strength of the radio wave, wherein the resonance frequency corresponds to a conductor pattern formed at a predetermined position of the transmitting antenna.

2. The connecting system of claim 1, wherein:
the transmitting antenna is coupled at a first end of the first interlock circuit; and
the resonance frequency comprises a resonance frequency band or a resonance frequency bandwidth.

3. The connecting system of claim 2, further comprising a plurality of branch connectors each including a corresponding first interlock circuit and a corresponding transmitting antenna, wherein the transmitting antennas of different branch connectors are configured to transmit radio waves of different resonance frequency bands or different resonance frequency bandwidths.

4. The connecting system of claim 3, wherein each of the transmitting antennas comprises a monopole antenna configured to transmit a radio wave of a different resonance frequency band from others of the transmitting antennas.

5. The connecting system of claim 1, wherein the controller is configured to determine that the connection defect of the identified branch connector has occurred when the electric field strength of the radio wave is smaller than or equal to a predetermined reference value.

6. The connecting system of claim 1, wherein the controller is configured to identify the branch connector and determine whether the connection defect has occurred in the identified branch connector by matching a lookup table and the received radio wave.

7. The connecting system of claim 1, wherein:
the transmitting antenna is at a first end of the second interlock circuit; and
the resonance frequency comprises a resonance frequency band or a resonance frequency bandwidth.

8. A method for detecting a connector having a connection defect on a connection between a branch connector and a plurality of connectors, wherein the branch connector is connected to a battery so as to branch a high voltage and the connectors each include a load connector that transfers the branched high voltage to a load, the method comprising:
receiving radio waves transmitted by a plurality of transmitting antennas supplied with electric power when a closed circuit is formed by a first interlock circuit within the branch connector being connected to a second interlock circuit within the load connector at a time of connection of the branch connector and the load connector;
identifying the plurality of connectors based on a resonance frequency of each of the radio waves, wherein the resonance frequency corresponds to a conductor pattern formed at a predetermined position of the respective transmitting antenna; and
determining whether the connection defect occurs for each of the plurality of connectors based on an electric field strength of each of the radio waves.

9. The method of claim 8, wherein identifying the plurality of connectors comprises identifying the plurality of connectors based on a resonance frequency band or a resonance frequency bandwidth of the radio waves.

10. The method of claim 9, wherein identifying the plurality of connectors comprises matching the resonance frequency band or the resonance frequency bandwidth of the radio waves with a lookup table to identify the plurality of connectors.

11. The method of claim 8, wherein determining whether the connection defect occurs for each of the plurality of connectors comprises determining that, when the electric field strength of the corresponding radio wave is smaller than or equal to a predetermined reference value, the connection defect has occurred at a corresponding connector.

12. The method of claim 11, wherein the reference value is stored in a lookup table.

13. The method of claim 11, wherein:
each of the transmitting antennas is positioned at a first end of the respective first interlock circuit; and
the resonance frequency comprises a resonance frequency band or a resonance frequency bandwidth.

14. The method of claim 13, wherein each of the transmitting antennas comprises a monopole antenna configured to transmit a radio wave of a different resonance frequency band from others of the transmitting antennas.

15. The method of claim 8, wherein:
each of the transmitting antennas is positioned at a first end of the respective second interlock circuit; and
the resonance frequency comprises a resonance frequency band or a resonance frequency bandwidth.

16. A method for detecting a connection defect, the method comprising:
connecting a branch connector to a battery to branch a high voltage;
connecting a first interlock circuit within the branch connector to a second interlock circuit within a load connector to form a closed circuit when the load connector that transfers the branched high voltage to a load is connected to the branch connector;
receiving, by a transmitting antenna, electric power from a power source when the closed circuit is formed, and transmitting a radio wave;
identifying the branch connector based on a resonance frequency of the radio wave, wherein the resonance frequency corresponds to a conductor pattern formed at a predetermined position of the transmitting antenna; and
determining whether the connection defect occurs in the identified branch connector based on an electric field strength of the radio wave.

17. The method of claim 16, wherein:
the transmitting antenna is positioned at a first end of the first interlock circuit; and
the resonance frequency comprises a resonance frequency band or a resonance frequency bandwidth.

18. The method of claim 16, wherein the transmitting antenna comprises a monopole antenna and transmits a radio wave of a different resonance frequency band from other transmitting antennas.

19. The method of claim 16, further comprising determining the connection defect has occurred by determining the electric field strength of the radio wave is smaller than or equal to a predetermined reference value.

20. The method of claim 16, wherein identifying the branch connector and determining whether the connection defect has occurred in the identified branch connector comprise matching a lookup table and the received radio wave.

* * * * *